(12) United States Patent
Zaima et al.

(10) Patent No.: US 9,018,665 B2
(45) Date of Patent: *Apr. 28, 2015

(54) SEMICONDUCTOR LIGHT EMITTING DEVICE AND METHOD FOR MANUFACTURING THE SAME

(71) Applicant: Kabushiki Kaisha Toshiba, Minato-ku (JP)

(72) Inventors: Kotaro Zaima, Tokyo (JP); Toru Gotoda, Yokohama (JP); Toshiyuki Oka, Yokohama (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/326,516

(22) Filed: Jul. 9, 2014

(65) Prior Publication Data

US 2014/0319458 A1    Oct. 30, 2014

Related U.S. Application Data

(62) Division of application No. 14/057,445, filed on Oct. 18, 2013, now Pat. No. 8,809,833, which is a division of application No. 13/665,650, filed on Oct. 31, 2012, now Pat. No. 8,822,250, which is a division of application No. 12/874,425, filed on Sep. 2, 2010, now Pat. No. 8,314,437.

(30) Foreign Application Priority Data

Mar. 3, 2010 (JP) ................................. 2010-046883

(51) Int. Cl.
*H01L 21/00* (2006.01)
*H01L 33/06* (2010.01)
(Continued)

(52) U.S. Cl.
CPC ............... *H01L 33/06* (2013.01); *H01L 21/18* (2013.01); *H01L 33/04* (2013.01); *H01L 33/22* (2013.01); *H01L 33/24* (2013.01)

(58) Field of Classification Search
CPC ......... H01L 33/06; H01L 33/22; H01L 33/24; H01L 33/04; H01L 21/18
USPC ............................................. 257/98, 13, 100
See application file for complete search history.

(56) References Cited

U.S. PATENT DOCUMENTS 8,178,891 B2 * 5/2012 Zaima et al. .................... 257/98
8,314,437 B2   11/2012 Zaima et al.
(Continued)

FOREIGN PATENT DOCUMENTS

JP   2001-144321    5/2001
JP   2007-165409    6/2007
(Continued)

OTHER PUBLICATIONS

Office Action issued Nov. 15, 2011 in Japanese Application No. 2010-046883 (w/English-language translation).

(Continued)

*Primary Examiner* — Laura Menz
(74) *Attorney, Agent, or Firm* — Oblon, McClelland, Maier & Neustadt, L.L.P.

(57) ABSTRACT

Certain embodiments provide a method for manufacturing a semiconductor light emitting device, including: providing a first stack film on a first substrate, the first stack film being formed by stacking a p-type nitride semiconductor layer, an active layer having a multiquantum well structure of a nitride semiconductor, and an n-type nitride semiconductor layer in this order; forming an n-electrode on an upper face of the n-type nitride semiconductor layer; and forming a concave-convex region on the upper face of the n-type nitride semiconductor layer by performing wet etching on the upper face of the n-type nitride semiconductor layer with the use of an alkaline solution, except for a region in which the n-electrode is formed.

5 Claims, 5 Drawing Sheets

(51) Int. Cl.
*H01L 21/18* (2006.01)
*H01L 33/04* (2010.01)
*H01L 33/22* (2010.01)
*H01L 33/24* (2010.01)

(56) References Cited

U.S. PATENT DOCUMENTS

| | | | |
|---|---|---|---|
| 8,325,295 B2 | 12/2012 | Sugita et al. | |
| 8,329,489 B2 | 12/2012 | Ohba et al. | |
| 8,334,153 B2 | 12/2012 | Gotoda et al. | |
| 8,552,445 B2 * | 10/2013 | Wakai et al. | 257/98 |
| 8,809,833 B2 * | 8/2014 | Zaima et al. | 257/13 |
| 2008/0048104 A1 | 2/2008 | Oka et al. | |
| 2010/0055819 A1 | 3/2010 | Ohba et al. | |
| 2010/0264443 A1 | 10/2010 | Wakai et al. | |
| 2011/0215292 A1 | 9/2011 | Zaima et al. | |
| 2011/0215293 A1 | 9/2011 | Zaima et al. | |
| 2011/0220935 A1 | 9/2011 | Gotoda et al. | |
| 2012/0199811 A1 | 8/2012 | Zaima et al. | |
| 2012/0286284 A1 | 11/2012 | Tachibana et al. | |
| 2012/0292631 A1 | 11/2012 | Katsuno et al. | |
| 2012/0295377 A1 | 11/2012 | Sato et al. | |
| 2013/0059408 A1 | 3/2013 | Zaima et al. | |
| 2013/0065340 A1 | 3/2013 | Ohba et al. | |

FOREIGN PATENT DOCUMENTS

| | | |
|---|---|---|
| JP | 2007-220971 | 8/2007 |
| JP | 2007-221029 | 8/2007 |
| JP | 2007-227895 | 9/2007 |
| JP | 2007-300069 | 11/2007 |
| JP | 2008-047861 | 2/2008 |
| JP | 2008-108952 | 5/2008 |
| JP | 2008-235362 | 10/2008 |
| JP | 2009-238879 | 10/2009 |
| JP | 2009-252826 | 10/2009 |

OTHER PUBLICATIONS

Office Action issued Jul. 2, 2013 in Japanese Patent Application No. 2012-004083 (with English language translation).

Japanese Office Action mailed Feb. 4, 2014 for Japanese Patent Application No. 2012-004083 (w/English translation).

* cited by examiner

THIS EMBODIMENT (a)   COMPARATIVE EXAMPLE (b)

FIG. 4

5 MINUTES (a)   15 MINUTES (b)

SEMICONDUCTOR LIGHT EMITTING DEVICE AND METHOD FOR MANUFACTURING THE SAME

CROSS-REFERENCE TO RELATED APPLICATION

This application is a division of and claims the benefits of priority under 35 U.S.C. §120 from U.S. Ser. No. 14/057,445 filed Oct. 18, 2013, which is a division of Ser. No. 13/665,650 filed Oct. 31, 2012, which is a division of U.S. Ser. No. 12/874,425 filed Sep. 2, 2010 (now U.S. Pat. No. 8,314,437 issued Nov. 20, 2012), and claims the benefit of priority under 35 U.S.C. §119 from Japanese Patent Application No. 2010-46883 filed Mar. 3, 2010, the entire contents of each of which are incorporated herein by reference.

FIELD

Embodiments described herein relate to a semiconductor light emitting device and a method for manufacturing the semiconductor light emitting device.

BACKGROUND

To achieve high efficiencies and high outputs, nitride semiconductor light emitting devices (hereinafter also referred to as LEDs (Light Emitting Diodes)) designed for white lighting devices are being improved in crystalline structures and device structures, and higher internal quantum efficiencies and higher light extraction efficiencies are being realized.

Where InGaN-based crystals are grown, a sapphire substrate is often used, because it is inexpensive and stable. A crystal growth with high crystallinity can be performed on a sapphire substrate with a low-temperature buffer. However, being an insulator, a sapphire substrate does not have conductive properties and is low in thermal conductivity. Therefore, electrodes cannot be formed on the back face side of a sapphire substrate, and p- and n-electrodes need to be formed on the nitride semiconductor side. Therefore, the tendency to cause higher series resistance and the low heat release properties during a high-power operation become problems in achieving even higher efficiencies and outputs.

A thin-film InGaN-based LED is known as one of the LED structures that eliminate the above problems and improve luminous efficiencies and outputs. Such a thin-film InGaN-based LED transfers LED structural crystals grown on a sapphire substrate onto another supporting substrate such as a Si substrate, a copper substrate, or a gold substrate. As devices are formed after the transfer onto a supporting substrate having conductive properties and high thermal conductivity, the current spread becomes larger by vertical energization, and the electric conductive properties are improved. Further, the heat release properties are also improved.

Also, by forming a structure that has an n-layer as an upper face through a transfer and extracts light from the n-layer side, a transparent electrode for diffusing current becomes unnecessary for the n-layer having lower resistance than a p-layer. Since light is not absorbed by a transparent electrode, the light extraction efficiency becomes higher. This process of transfer includes a process to bond crystals (epitaxial crystals) formed through an epitaxial growth to the supporting substrate, and a lift-off process to detach the epitaxial crystals from the sapphire substrate. The bonding process may involve a plating technique or a joining technique utilizing weight and heat, and the lift-off process may involve a laser lift-off technique utilizing thermolysis of an interface caused by a laser or a chemical lift-off technique.

In such a thin-film LED structure, the difference in refractive index between the surface of a GaN substrate and the external air is as large as 2.5 times where only a laser lift-off process has been carried out, and the light reflection from the boundary face lowers the light extraction efficiency.

To counter this problem, a technique of producing concavities and convexities on the surface of a chip has been suggested. The concavities and convexities are formed by regrowing, polishing, and etching an n-type nitride semiconductor layer. According to a method for simple formation, concavities and convexities are formed by roughening the surface through alkaline etching performed on the n-layer on the upper face of a GaN substrate on a supporting substrate. In this manner, the light extraction efficiency is made higher.

By the conventional alkaline etching, however, the sizes of the concavities and convexities cannot be made larger in many cases, even though the entire film thickness is reduced by prolonging the etching period. Therefore, there is a demand for an etching control method by which such concavities and convexities as to improve the light extraction efficiency can be formed on the surface of a GaN layer.

DETAILED DESCRIPTION

Certain embodiments provide a manufacture method including forming an n-electrode is formed on the upper face of the n-type nitride semiconductor layer of each device, and performing wet etching on the upper face of the n-type nitride semiconductor layer with the use of an alkaline solution, to form concavities and convexities during the formation of optical semiconductor devices.

A semiconductor light emitting device according to the embodiment is characterized in that a concave-convex region is formed in the surface of an n-type nitride semiconductor layer, except for the region where an n-electrode is formed, and in the concave-convex region, first concavities and convexities having height differences of 1 to 3 μm coexist with second concavities and convexities that have height differences of 300 nm or less and are smaller than the first concavities and convexities.

The following is a detailed description of an embodiment, with reference to the accompanying drawings.

Referring to FIGS. 1(a) through 4, a method for manufacturing semiconductor light emitting devices according to an embodiment is described. FIGS. 1(a) through 3(c) show the procedures for manufacturing semiconductor light emitting devices according to the first embodiment.

First, nitride semiconductor layers are sequentially grown on a substrate (a wafer) for growing nitride semiconductor crystals or a sapphire substrate 10 by metal organic chemical vapor deposition (MOCVD), for example. More specifically, a GaN layer 12 to be a buffer layer, an n-type GaN layer 14, an active layer 16 of a multiquantum well structure made of InGaN, and a p-type GaN layer 18 are sequentially grown in this order on the sapphire substrate 10 (FIG. 1(a)).

P-electrodes (reflecting contact electrodes) 20 are then formed with stack films of Ni and Ag on the p-type GaN layer 18 (FIG. 1(b)). The p-electrodes 20 are formed for respective semiconductor light emitting devices. An adhesive metal film 22 having Ti, Pt, and Au films that are to serve as adhesive metals and are stacked in this order is formed over the nitride semiconductor crystal films 12, 14, 16, and 18, to cover the p-electrodes 20 (FIG. 1(b)). With this arrangement, the portions of the adhesive metal film 22 in the regions where the p-electrodes 20 are formed are turned into convex portions, and the portions of the adhesive metal film 22 in the regions where the p-electrodes 20 are not formed are turned into concave portions (FIG. 1(b)). Patterning is then performed on the adhesive metal film 22 by a known lithography technique. After that, patterning is further performed on the stack film (the nitride semiconductor crystal films) including the p-type GaN layer 18, the active layer 16, the n-type GaN layer 14, and the GaN layer 12 (FIG. 1(c)).

Through the patterning, the nitride semiconductor crystal films on the wafer are turned into a mesa having a tapered shape in cross-section, with the area of the film plane gradually increasing from the area of the film plane of the p-type GaN layer 18 to that of the GaN layer 12. Here, the "film plane" means the upper plane of each of the layers. When patterning is performed on the stack film, a patterned adhesive metal film may be used as a mask. Alternatively, patterning may be performed on the stack film before the adhesive metal film 22 is formed, and after the patterning, the adhesive metal film 22 may be formed.

Meanwhile, an Au—Sn layer 32 to be an adhesive metal film is formed on a Si substrate 30 to be a supporting substrate (FIG. 2(a)). The adhesive metal film 22 on the sapphire substrate 10 and the adhesive metal film 32 on the Si substrate 30 are placed to face each other, and pressure is applied to them at a high temperature of 250° C. or higher over a certain period of time, so that the adhesive metal film 22 on the sapphire substrate 10 and the adhesive metal film 32 on the Si substrate 30 are bonded to each other. In this bonding, the contact electrodes 20 are buried into the adhesive metal film 32, since the melting-point temperature of the contact electrodes 20 is much higher than the melting-point temperature of the adhesive metal film 32 (FIG. 2(a))

As shown in FIG. 2(b), pulse irradiation is then performed with a UV (Ultra-Violet) laser or a KrF laser of 248 nm in wavelength from the side of the sapphire substrate 10, for example, so as to detach the sapphire substrate 10 from the nitride semiconductor crystal films 12, 14, 16, and 18. The surface of the GaN layer 12 exposed at this point is the surface to be subjected to wet etching.

Patterning is then performed on the nitride semiconductor crystal films 12, 14, 16, and 18 by a known lithography technique, to divide the nitride semiconductor crystal films 12, 14, 16, and 18 into semiconductor light emitting devices (FIG. 3(a)). At this point, patterning is not performed on the adhesive metal film 22, and the adhesive metal film 22 is left exposed among the nitride semiconductor crystal films divided into the semiconductor light emitting devices. The patterned nitride semiconductor crystal films are turned into mesas each having a tapered shape in cross-section, with the area of the film plane gradually increasing from the area of the film plane of each GaN layer 12 to that of each p-type GaN layer 18.

A $SiO_2$ film 40 as a protection film is then formed to cover the surfaces of the nitride semiconductor crystal films of a tapered shape and the exposed adhesive metals 22 and 32, for example (FIG. 3(b)). The nitride semiconductor crystal films form mesa structures, the minimum diameter of each lower face of the nitride semiconductor crystal films in contact with the adhesive metal film 22 is smaller than the minimum diameter of the upper face of the adhesive metal film 22, and the minimum diameter of the lower face of the adhesive metal film 22 in contact with the adhesive metal film 32 is smaller than the minimum diameter of the upper face of the adhesive metal film 32. Accordingly, the adhesive metal film 22 is in tight contact with the peripheral end region of each lower portion of the nitride semiconductor crystal films each having a mesa shape, and the protection layer 40 without a step separation can be formed, without a void formed between the protection layer 40 and the adhesion metal films 22 and 32.

The protection layer 40 covering the upper face of each semiconductor light emitting device is then removed. However, the protection layer 40 remains on the outer circumferential region of the upper face of each semiconductor light emitting device (the upper face of each GaN layer 12). With this arrangement, the upper face of each semiconductor light emitting device is exposed, except for the outer circumferential region of each upper face (FIG. 3(c)). At this point, the surface roughness of the upper face of each GaN layer 12 is approximately in the range of 100 nm to 3000 nm.

N-electrodes 44 are then formed at the center portions of the exposed upper faces of the GaN layers 12 (FIG. 3(c)). The n-electrodes 44 may not necessarily be formed at the center portions, but may be formed anywhere on the exposed upper faces of the GaN layers 12. As the material of the n-electrodes 44, it is preferable to use an alkali-resistant electrode material. It is particularly preferable to use a material containing one of the following metals: Pt, Au, Ni, and Ti. By using such a material, the sizes (height differences) of the concavities and convexities formed in the upper faces of the GaN layers 12 by the later described alkaline etching can be made larger. Since the n-electrodes 44 are formed on the flat GaN layers 12, excellent adhesion properties can be achieved.

After the n-electrodes 44 are formed, an alkali solution is supplied, and wet etching is performed on the exposed upper faces of the GaN layers 12. In this manner, the exposed upper faces of the GaN layers 12 are roughened, or the GaN layers 12 are turned into GaN layers 12a each having concavities and convexities formed in its exposed upper face (FIG. 3(c)). As the wet etching is performed after the n-electrodes 44 are formed, the etching efficiency becomes higher, and deeper concavities and convexities can be obtained. This is supposedly because electrons or holes travel between the surfaces of the GaN layers 12 and the n-electrodes 44, and an electrochemical reaction is caused in each surface, accelerating the etching. One n-electrode 44 is formed for each one optical semiconductor device. Accordingly, larger concavities and convexities are obtained, compared with a case where one electrode is provided for one wafer. Also, a uniformly etched state can be achieved in each device in the plane of a wafer.

In this embodiment, a potassium hydroxide solution of 1 mol/l in density and 70° C. in temperature is used as the alkaline solution, and etching is performed for 15 minutes. As the etching smoothly progresses, the surface becomes clouded. While being immersed in the potassium hydroxide solution, the concavities and convexities are exposed to UV rays, and are made even larger as a result. The sizes of the concavities and convexities are several hundreds of nanometers to several micron meters. The concavities and convexities can also be made larger by performing etching while applying a voltage of 3 to 10 V intermittently between the n-electrodes 44 and the GaN layers 12.

Figure 4:
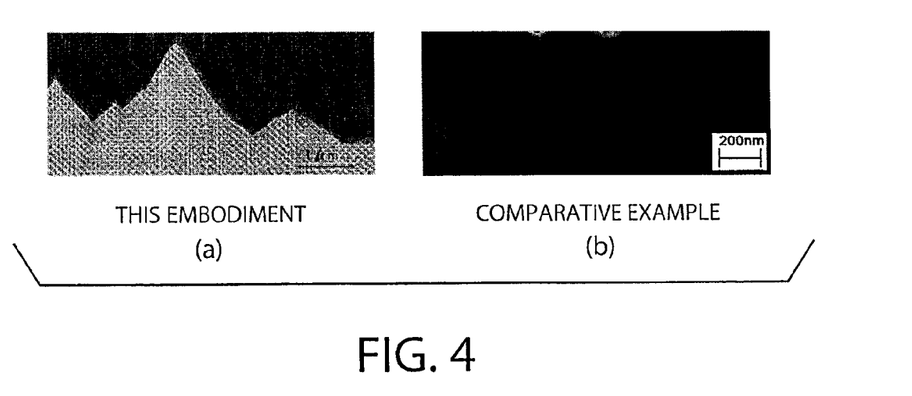
FIGS. 4(a) and 4(b) are electron micrographs of sections in the vicinities of the surfaces having concavities and convexities formed thereon in semiconductor light emitting devices according to the embodiment and a comparative example.

FIG. 4(*a*) shows an electron micrograph of a section of the surface of a GaN layer 12 having concavities and convexities formed in the above described manner. As can be seen from FIG. 4(*a*), the concavities and convexities vary in size. When the heights of (or the height differences among) the concavities and convexities formed in the GaN layer 12 according to this embodiment are observed in surface and cross-sectional images through electron microscopy images, large concavities and convexities of several micron meters (1 µm to 3 µm) coexist with small-order concavities and convexities of several hundreds of nanometers (300 nm or less). Accordingly, the reflection from the boundary surface between each GaN layer 12 and the air becomes smaller, and the light extraction efficiency can be made higher. As a comparative example of this embodiment, semiconductor light emitting devices are formed in the same manner as in this embodiment, except that etching is performed on the upper face of each GaN layer 12 without the formation of the n-electrodes 44. FIG. 4(*b*) shows an electron micrograph of a section of the surface of the GaN layer 12 having concavities and convexities in a semiconductor light emitting device of this comparative example. As can be seen from FIGS. 4(*a*) and 4(*b*), the concavities and convexities formed in the semiconductor light emitting device of this embodiment are larger than the concavities and convexities formed in the semiconductor light emitting device of the comparative example. When the heights of the concavities and convexities formed on the GaN layers 12 according to the comparative example are measured, only small concavities and convexities of approximately 200 nm are observed, and large-order concavities and convexities of 1 µm seen in this embodiment are not observed.

Figure 5:
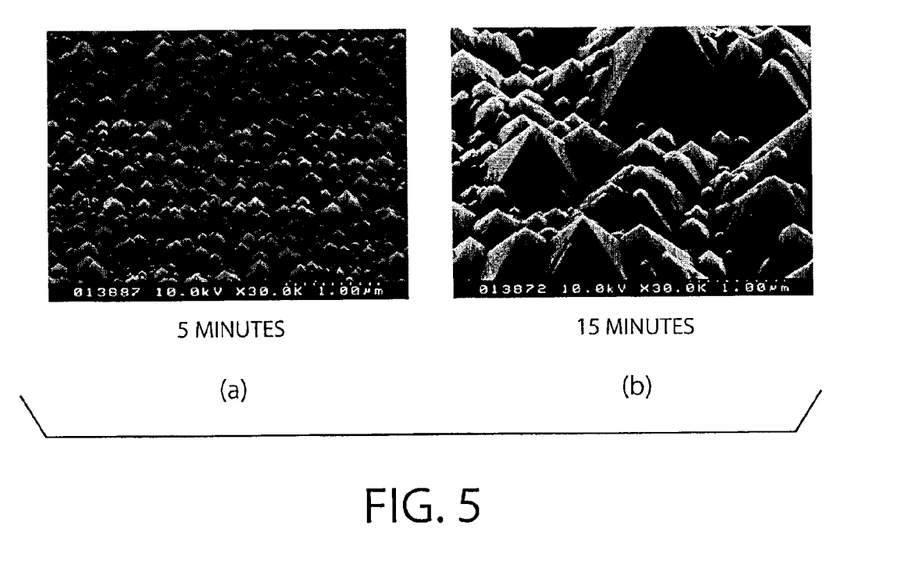
FIGS. 5(a) and 5(b) are electron micrographs of the surfaces of semiconductor light emitting devices according to the embodiment in a case where the etching period is varied.

FIGS. 5(*a*) and 5(*b*) show electron micrographs of the surfaces of GaN layers 12 having concavities and convexities formed thereon in a case where etching is performed for five minutes and in a case where etching is performed for fifteen minutes by the manufacture method according to this embodiment. As can be seen from FIGS. 5(*a*) and 5(*b*), large concavities and convexities coexist with small concavities and convexities when the etching is performed for fifteen minutes as in this embodiment, but only small concavities and convexities are formed when the etching is performed for approximately five minutes.

Figure 6:
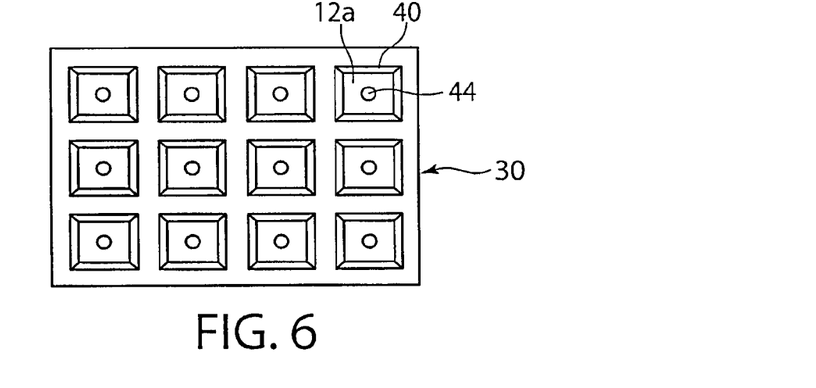
FIG. 6 is a plan view of the supporting substrate prior to the division into respective devices.

FIG. 6 is a plan view of semiconductor light emitting devices seen from the side of the n-electrodes 44 after the concavities and convexities are formed. As can be seen from FIG. 6, undivided devices are placed on the Si substrate 30. After that, a p-electrode 46 is formed on the face of the silicon substrate 30 on the opposite side from the side on which the n-electrodes 44 are formed, as shown in FIG. 3(*c*).

Figure 1:
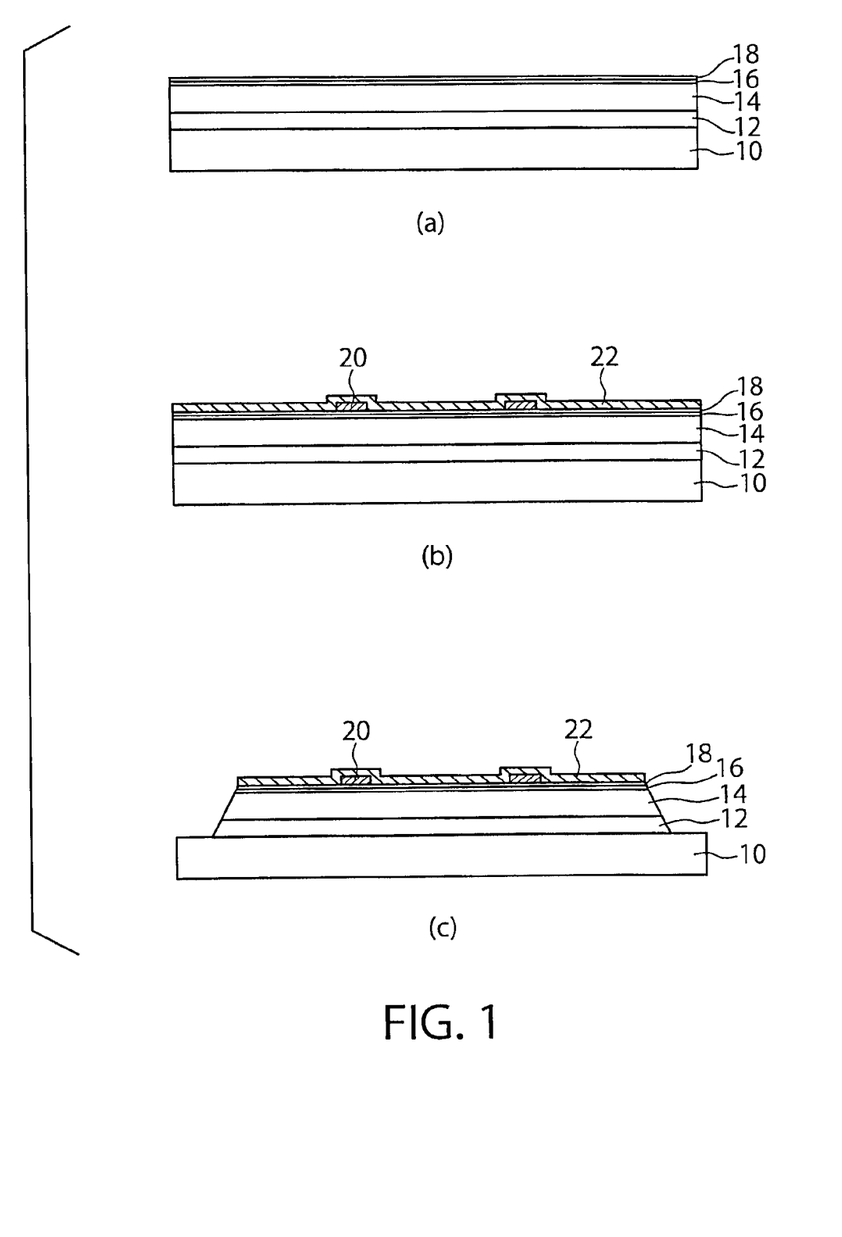
FIGS. 1(a) through 1(c) are cross-sectional views showing procedures for manufacturing semiconductor light emitting devices according to an embodiment.
Figure 2:
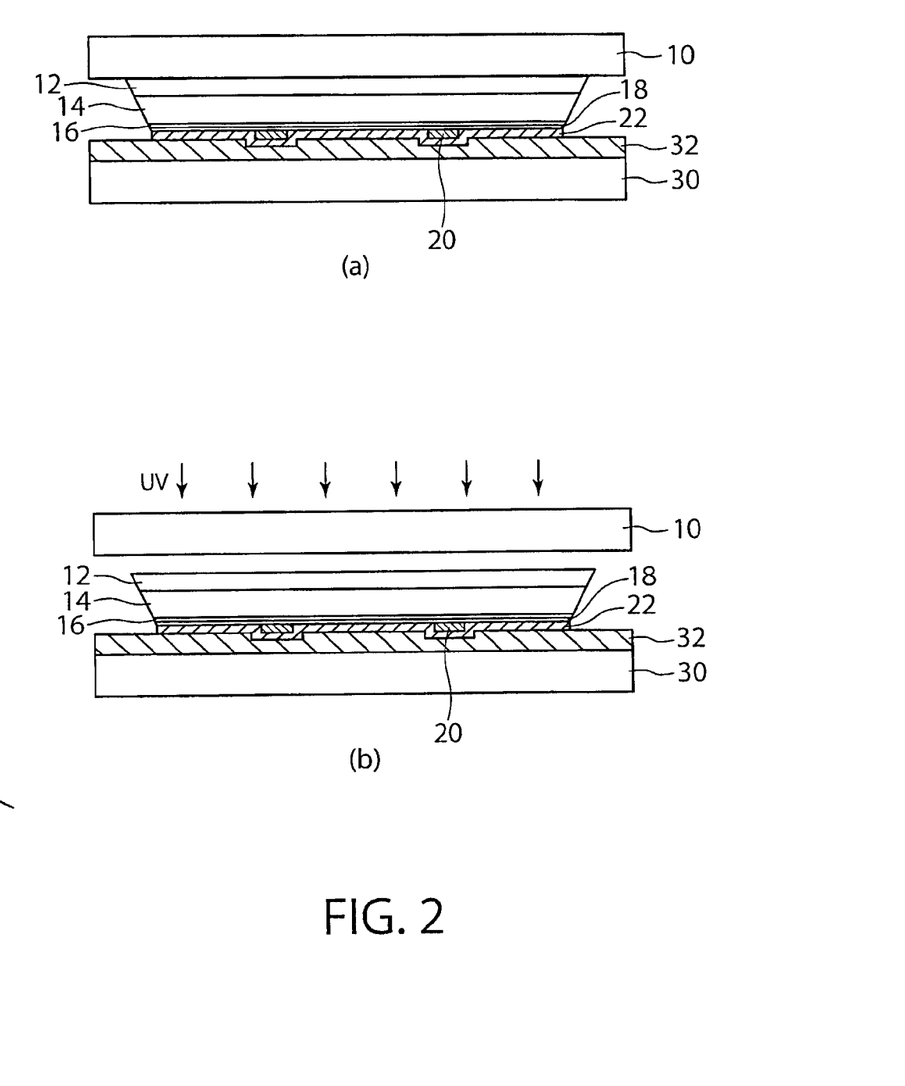
FIGS. 2(a) and 2(b) are cross-sectional views showing procedures for manufacturing semiconductor light emitting devices according to the embodiment.
Figure 3:
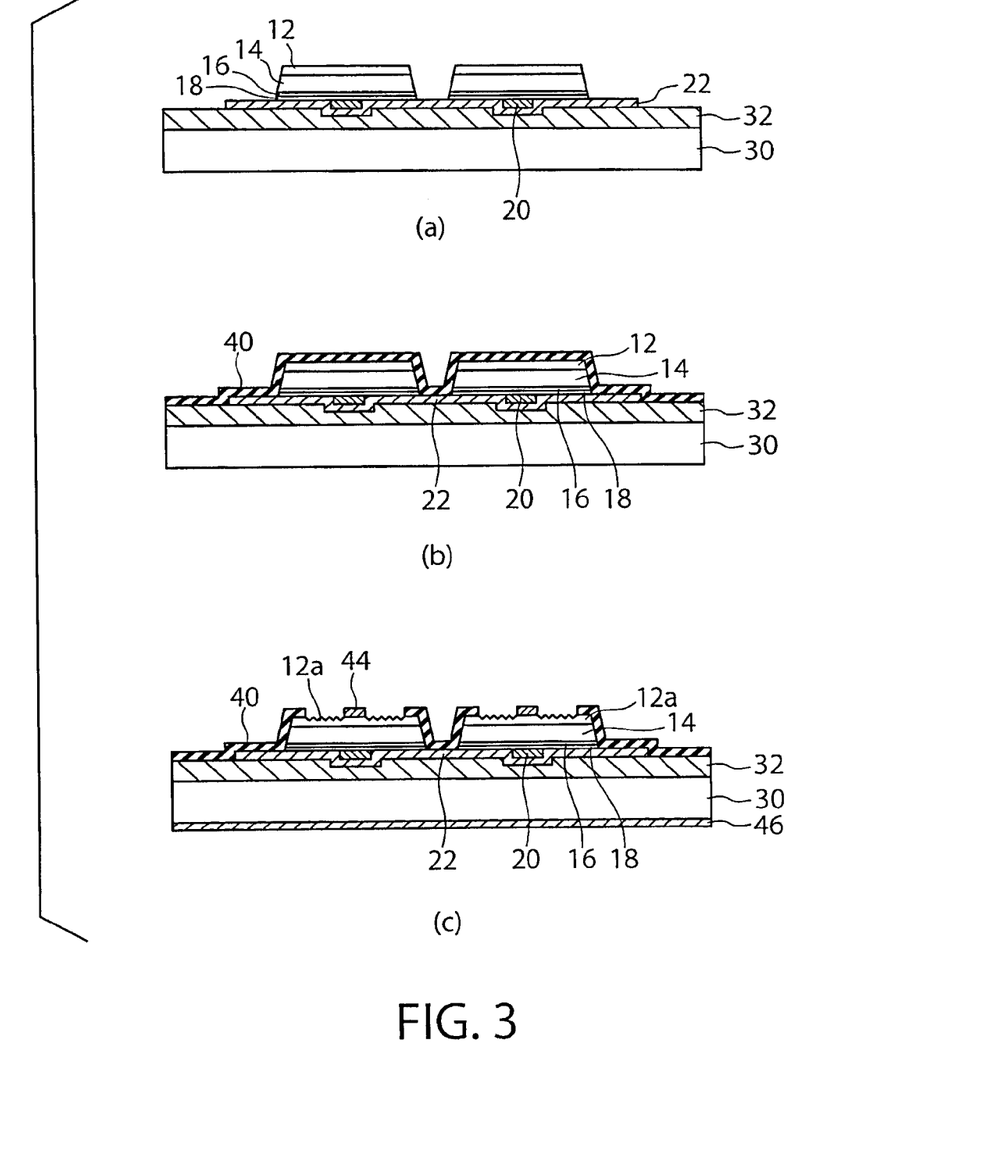
FIGS. 3(a) through 3(c) are cross-sectional views showing procedures for manufacturing the semiconductor light emitting devices according to the embodiment.
Figure 7:
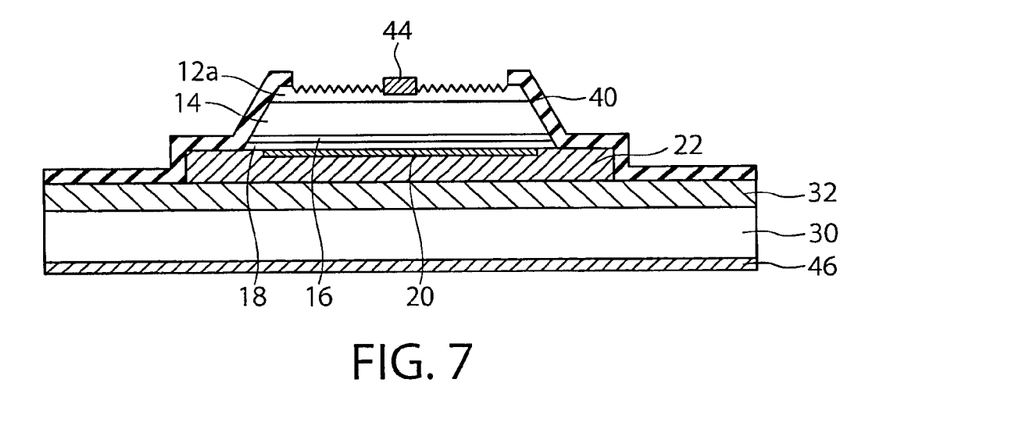
FIG. 7 is a cross-sectional view of a semiconductor light emitting device according to the embodiment.
Figure 8:
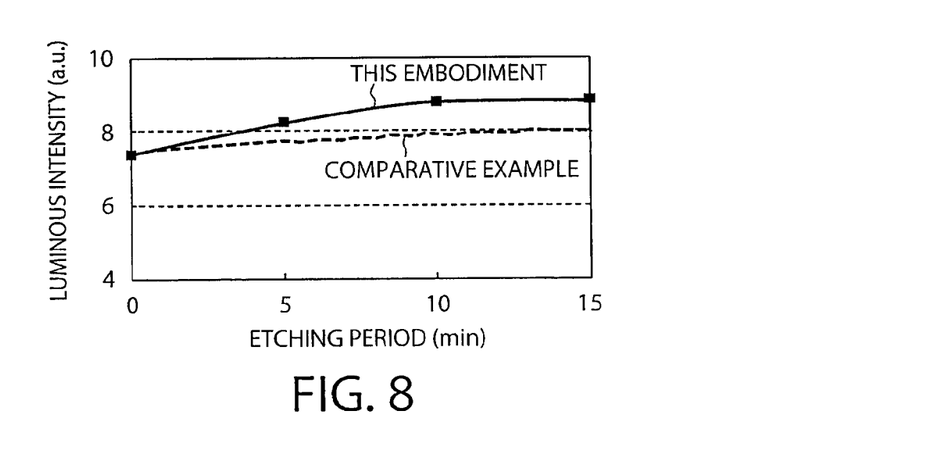
FIG. 8 is a graph showing the etching period dependencies of the emission intensities of the semiconductor light emitting devices according to the embodiment and the comparative example.

After the procedures shown in FIG. 3(*c*) are completed, dicing is performed on the protection layer 40, the adhesive metal films 22 and 32, and the Si substrate 30, to divide them into respective semiconductor light emitting devices. In this manner, the semiconductor light emitting device shown in FIG. 7 is completed. The semiconductor light emitting devices of the above described comparative example are also divided by dicing. The light extraction efficiency of the semiconductor light emitting devices of this embodiment manufactured in the above described manner is 1.2 times higher than the light extraction efficiency of the semiconductor light emitting devices of the comparative example, as shown in FIG. 8. FIG. 8 is a graph showing the fluctuations of the emission intensities of the semiconductor light emitting devices of this embodiment and the comparative examples observed in a case where the etching period is varied As described so far, this embodiment can provide a method for manufacturing semiconductor light emitting devices that have high light extraction efficiency.

In this embodiment, part of the upper face, the side faces of the nitride semiconductor crystal films, and the bonding portions between the side faces and the adhesive metals are covered with the protection layer 40 without a step separation. Therefore, even where the upper face of the nitride semiconductor crystal films is roughened with the use of an alkaline solution, the active layer and the reflecting contact electrodes 20 can be thoroughly protected. Accordingly, reflecting contact electrodes 20 each having a large area can be formed, and the reflectivity can be made higher. Furthermore, a decrease in operating voltage can be expected, since large contact electrodes can be formed. Also, since the protection layer 40 without a step separation is formed, leakage and short-circuiting in devices due to metal adherence or the like during the manufacturing procedures can be prevented. Further, since the protection layer 40 without a step separation is formed, the process to manufacture thin-film semiconductor light emitting devices can be tolerated, even though the process involves intensified impacts from the bonding and the laser lift-off technique, for example. Also, cracks and the like are not formed in the protection layer 40.

The supporting substrate may be a silicon substrate, a silicon carbide substrate, a substrate formed by bonding germanium to a silicon substrate, or a substrate formed by plating a silicon substrate with a metal such as copper. The silicon substrate may be a substrate that has a plane orientation of (111), (110), or (100), and also has an off angle.

As for the protection layer, it is preferable to use a material that contains silicon dioxide, silicon nitride, zirconium oxide, niobium oxide, or aluminum oxide.

The chemical solution used in the alkaline etching may be tetramethylammonium hydroxide, other than potassium hydroxide. The desired density here is 0.1 mol/l to 10 mol/l.

As the contact electrodes 20, it is desirable to use aluminum, other than silver.

The adhesive metal film 22 preferably contains titanium, platinum, gold, or tungsten.

As the adhesive metal film 32, it is possible to use a low-melting-point metal that is a metal eutectic such as Au—Si, Ag—Sn—Cu, or Sn—Bi, or a non-solder material such as Au, Sn, or Cu, other than Au—Sn.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor light emitting device comprising:
a stack film including a p-type nitride semiconductor layer, an n-type nitride semiconductor layer, and an active layer provided between the p-type nitride semiconductor layer and the n-type nitride semiconductor layer, the active layer including a multiquantum well structure of a nitride semiconductor layer;
an n-electrode connected to the n-type nitride semiconductor layer;
a p-electrode connected to the p-type nitride semiconductor layer; and
a concave-convex region provided on a surface of the n-type nitride semiconductor layer,
the concave-convex region having first concavities and convexities and second concavities and convexities that are smaller than the first concavities and convexities, the first concavities and convexities randomly coexisting with the second concavities and convexities, the first concavities and convexities having height differences of 1 µm to 3 µm, and the second concavities and convexities having height differences of 300 nm or smaller.

2. The device according to claim 1, wherein the n-electrode contains one of Pt, Ni, Au, and Ti.

3. The device according to claim 1, wherein
the stack film includes a tapered shape in cross-section, with an area of a film plane gradually increasing from the n-type nitride semiconductor layer toward the p-type nitride semiconductor layer.

4. The device according to claim 1, further comprising:
a contact electrode provided on a surface of the p-type nitride semiconductor layer; and
a protection film protecting an outer circumferential region of the surface of the n-type nitride semiconductor layer, side faces of the stack film.

5. The device according to claim 4, further comprising:
a first metal layer provided on one side of the p-type nitride semiconductor layer opposite from the active layer, the first metal layer having a face facing to the surface of the p-type nitride semiconductor layer; and
a second metal layer provided between the first metal layer and the p-type nitride semiconductor layer, the second metal layer covering the contact electrode and being in contact with the contact electrode and the first metal layer, and the second metal layer having a minimum diameter that is smaller than a minimum diameter of the face of the first metal layer but is larger than a minimum diameter of the surface of the p-type nitride semiconductor layer.

* * * * *